United States Patent [19]
Nishihara et al.

[11] Patent Number: 6,013,953
[45] Date of Patent: Jan. 11, 2000

[54] SEMICONDUCTOR DEVICE WITH IMPROVED CONNECTION RELIABILITY

[75] Inventors: Toshiyuki Nishihara; Yasunori Tanaka; Michinobu Tanioka; Masahiro Fujii, all of Tokyo, Japan

[73] Assignee: NEC Corporation, Tokyo, Japan

[21] Appl. No.: 09/008,006

[22] Filed: Jan. 16, 1998

[30] Foreign Application Priority Data

Jan. 16, 1997 [JP] Japan .................................. 9-005404

[51] Int. Cl.⁷ .................................................. H01L 23/48
[52] U.S. Cl. ........................ 257/778; 257/773; 257/787; 257/678; 257/632
[58] Field of Search ..................... 257/666, 676, 257/690, 693, 692, 697, 698, 700, 734, 735, 736, 737, 738, 772, 774, 778, 779, 780, 781, 784, 786, 773, 678; 438/111, 123, 612, 613, 614, 617, 618, 667; 361/767, 768, 777, FOR 777

[56] References Cited

U.S. PATENT DOCUMENTS

| | | |
|---|---|---|
| 5,650,593 | 7/1997 | McMillan et al. . |
| 5,668,405 | 9/1997 | Yamashita ............................... 257/668 |
| 5,719,445 | 2/1998 | McClure ................................. 257/723 |
| 5,784,262 | 6/1998 | Sherman ................................ 361/777 |

FOREIGN PATENT DOCUMENTS

| | | |
|---|---|---|
| 0 332 402 A2 | 9/1989 | European Pat. Off. . |
| 0 704 897 A2 | 4/1996 | European Pat. Off. . |
| 0 794 896 A2 | 4/1996 | European Pat. Off. . |
| 0 751561 A1 | 1/1997 | European Pat. Off. . |
| 3-48239 | 5/1991 | Japan . |
| 5-82586 | 4/1993 | Japan . |
| 5-121488 | 5/1993 | Japan . |
| 7-142669 | 6/1995 | Japan . |
| 8-162599 | 6/1996 | Japan . |
| 8-204062 | 9/1996 | Japan . |
| 8-236586 | 9/1996 | Japan . |
| 8-306739 | 11/1996 | Japan . |
| WO 97/01866 A1 | 1/1997 | WIPO . |

*Primary Examiner*—Minh Loan Tran
*Assistant Examiner*—Luan Thai
*Attorney, Agent, or Firm*—Scully, Scott, Murphy & Presser

[57] ABSTRACT

A semiconductor device comprises a substrate on which a plurality of external connection terminals are formed, and a semiconductor chip provided with a plurality of connection terminals. The connection terminals are connected to corresponding external connection terminals by electrical wiring. Each of predetermined connection terminals in the connection terminals of the semiconductor chip is connected to two or more corresponding external connection terminals on the substrate. Preferably, 90% or more of the connection terminals of the semiconductor chip are connected to two or more corresponding external connection terminals. When the semiconductor device is installed on a circuit board, the semiconductor device is mounted on the circuit board with its external connection terminals facing the circuit board, and electric connections between the semiconductor device and the circuit board is established by the external connection terminals. According to the semiconductor device, connection reliability between the semiconductor device and the circuit board can be remarkably improved and installation process can be executed with a higher success rate and a remarkably higher degree of efficiency.

14 Claims, 7 Drawing Sheets

SEMICONDUCTOR DEVICE WITH IMPROVED CONNECTION RELIABILITY

BACKGROUND OF THE INVENTION

The present invention generally relates to a semiconductor device which includes a semiconductor chip and external connection terminals to be bonded to a circuit board on which the semiconductor device is installed, and in particular, to a semiconductor device in which connection reliability between the semiconductor device and the circuit board is improved.

DESCRIPTION OF THE RELATED ART

In recent years, various kinds of portable electronic equipments such as portable telephones, portable televisions, portable personal computers, etc. are put on the market, and market requirements for miniaturization, weight reduction, thinning, etc. of these products are intensely growing these years.

According to the requirements for miniaturization, weight reduction, thinning, etc. of such portable electronic equipment, requirement for miniaturization of semiconductor chips (dies) utilized in such portable electronic equipment is also growing. Therefore, development of large-scale semiconductor chips of small sizes is continuously pursued utilizing microscopic processing techniques. However, as the circuit scale of semiconductor chips becomes larger, the size of the semiconductor chips is necessitated to be larger and the number of terminals of the semiconductor chips for connecting to the outside increases, thereby the sizes of semiconductor devices which includes the semiconductor chips are necessitated to be larger.

In order to solve the above problem, various kinds of techniques are proposed in the field of semiconductor packaging. In semiconductor packaging techniques such as QFP (Quad Flat Package) and TSOP (Thin Small Outline Package), a semiconductor chip is sealed up in a resin package with its external connection leads protruding outside the package radially or to both sides of the package. Further, some techniques for narrowing the pitch between the external connection leads have been developed in order to prevent the semiconductor devices from becoming larger.

For further high-density designs of semiconductor devices, there are utilized some 'bare chip' installation techniques such as 'chip on board' installation and 'flip chip' installation. In the chip on board installation, a semiconductor chip itself without package or coating (i.e. a bare chip) is directly installed on a circuit board, and terminals of the semiconductor chip and terminals on the circuit board are connected by wires. In the flip chip installation, in order to reduce space for wiring, bumps (i.e. metal projections) are formed on terminals of a semiconductor chip, and connection between the semiconductor chip and a circuit board is executed via the bumps, by installing the semiconductor chip on the circuit board with its circuit surface facing the circuit board.

However, miniaturization of semiconductor devices by the bare chip installation techniques involves some problems. First, the acquisition of semiconductor chips with guaranteed characteristics and quality (known good dies) is difficult for the time being. Second, even in the case where semiconductor chips with guaranteed characteristics could be acquired, the characteristics of semiconductor chips tend to vary during the bare chip installation process.

Therefore, selection of semiconductor chips having highly stable characteristics is a necessary condition for the bare chip installation, and thus miniaturization of equipment by applying bare chip installation to all the semiconductor chips used in electronic equipment is very difficult so far and supply of known good dies by semiconductor chip manufacturers is required by electronic equipment manufacturers.

In order to meet the requirement, CSP (Chip Size Package) has been developed by semiconductor chip manufacturers. The CSP can be built up in the form of a semiconductor device package with guaranteed device characteristics, and needs only small installation space which is approximately the size of a semiconductor chip (nearly equal to the installation space of a flip chip).

The CSP can be installed on a circuit board and executed reflow process together with conventional SMDs (Surface Mount Devices), since the pitch between external connection terminals of CSPs can be widened to 0.5 mm to 1.0 mm, differently from the case of bare chip installation. Connection between a CSP and a printed circuit board is established via solder bumps which are formed on the CSP.

FIG. 1 is a partly sectional and broken perspective view showing a conventional CSP semiconductor device, which is seen from the installation surface of the device. A semiconductor chip 1 (such as an LSI) is mounted on a polyimide substrate 2 by adhesive 3, with its circuit surface provided with connection terminals 9 facing the substrate 2. On the reverse side of the polyimide substrate 2 (i.e. on the surface to which the semiconductor chip 1 is not mounted), solder bumps 7 composed of solder balls are formed on patterned copper foils 4, as external connection terminals. The copper foils 4 are coated with a photoresist layer 6 for preventing the solder bumps 7 from spreading out during installation process in which the semiconductor device is installed on a circuit board. Each copper foil 4 is formed and patterned on the polyimide substrate 2 to reach a point directly above a corresponding connection terminal 9 of the semiconductor chip 1. The copper foil 4 and the corresponding connection terminal 9 are electrically connected by a copper through hole 5. The connection is formed by means of 'gang bonding' or 'single point bonding' which are used in manufacturing TCP (Tape Carrier Package), thereby the solder bumps 7 and the connection terminals 9 on the semiconductor chip 1 are connected in a one-to-one correspondence. The semiconductor chip 1 is covered by a sealing resin 8 to protect itself from outside effects.

FIG. 2 is a vertical sectional view of the conventional semiconductor device of FIG. 1, in which the device is shown upside down compared to FIG. 1 (i.e. with its installation surface facing downward). In FIG. 2, the semiconductor chip 1 has a small number of pins, and the size of the semiconductor device is approximately the same size as the semiconductor chip 1. In the case where a semiconductor chip 1' provided with a large number of pins is used as shown in FIG. 3, a large number of solder bumps 7 are necessitated to be placed and some solder bumps 7 are placed outside the copper through hole 5, and thus the size of the semiconductor device becomes larger than the size of the semiconductor chip 1'. Such conventional semiconductor devices are disclosed, for example, in Japanese Patent Application Laid-Open No. HEI8-204062 etc.

Generally, external connection terminals of the aforementioned semiconductor device (Chip Size Package) are provided on the installation surface of the polyimide substrate 2 and are usually placed in a grid (lattice) pattern in order to provide a large number of external connection terminals on the surface. The grid pattern placement of external connection terminals composed of ball-like bumps is referred to as 'ball grid array'. Incidentally, use of bumps in connecting a semiconductor device to a circuit board is not a necessary condition and there exist connection methods using no such bumps.

However, such CSP semiconductor devices involve following drawbacks. First, such external connection terminals placed in the grid array pattern can not be seen from outside after the external connection terminals are directly attached to a circuit board. Therefore, it is impossible to check by seeing whether or not the connection via the external connection terminals has been completely done, and thus modification of connection can not be executed even when the connection via the external connection terminals is incomplete.

Accordingly, methods other than seeing have to be adopted for checking the completeness of the connection via the external connection terminals, such as LSI function test using measurement equipment, inspection by X-ray, etc. And when incompleteness of the connection is found by the check, the semiconductor device is removed from the circuit board and faulty external connection terminals are inspected and modified. After the modification, the semiconductor device is re-installed on the circuit board, and the connection via the external connection terminals has to be checked again by means of LSI function test etc. Generally, such procedure is much complicated and inefficient, and requires special tools and skilled workers.

SUMMARY OF THE INVENTION

It is therefore the primary object of the present invention to provide a semiconductor device by which connection reliability between the semiconductor device and a circuit board on which the semiconductor device is installed can be improved and connection inferiority rate can be reduced, thereby improving a success rate in installing process of surface mount devices and reducing manufacturing cost of electronic equipment.

In accordance with the present invention, there is provided a semiconductor device comprising a substrate on which a plurality of external connection terminals are formed, and a semiconductor chip provided with a plurality of connection terminals. The connection terminals are connected to corresponding external connection terminals by electrical wiring. Each of predetermined connection terminals in the connection terminals of the semiconductor chip is connected by electrical wiring to two or more corresponding external connection terminals on the substrate.

In accordance with another aspect of the present invention, 90% or more of the connection terminals of the semiconductor chip are connected to two or more corresponding external connection terminals.

Preferably, 90% or more of the connection terminals of the semiconductor chip are connected to two corresponding external connection terminals in a one-to-one correspondence.

In accordance with another aspect of the present invention, the external connection terminals are arranged on the installation surface of the semiconductor device in a grid pattern.

Preferably, the external connection terminals are arranged in a quadrangular grid pattern.

Preferably, the external connection terminal is composed of a solder ball.

Preferably, the external connection terminal is composed of a solder bump.

Preferably, the external connection terminal is composed of a metal ball.

Preferably, the external connection terminal is composed of a metal bump.

Preferably, the external connection terminal is composed of a metal land.

In accordance with another aspect of the present invention, the external connection terminals are arranged so that one of the two or more external connection terminals corresponding to the connection terminal is placed outside on the substrate and another one of the two or more external connection terminals is placed inside on the substrate.

In accordance with another aspect of the present invention, all the external connection terminals are arranged inside a quadrangle which is formed by the connection terminals of the semiconductor chip.

Preferably, the substrate is composed of a ceramic circuit board.

Preferably, the substrate is composed of a printed circuit board.

Preferably, the substrate is composed of a resin film.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
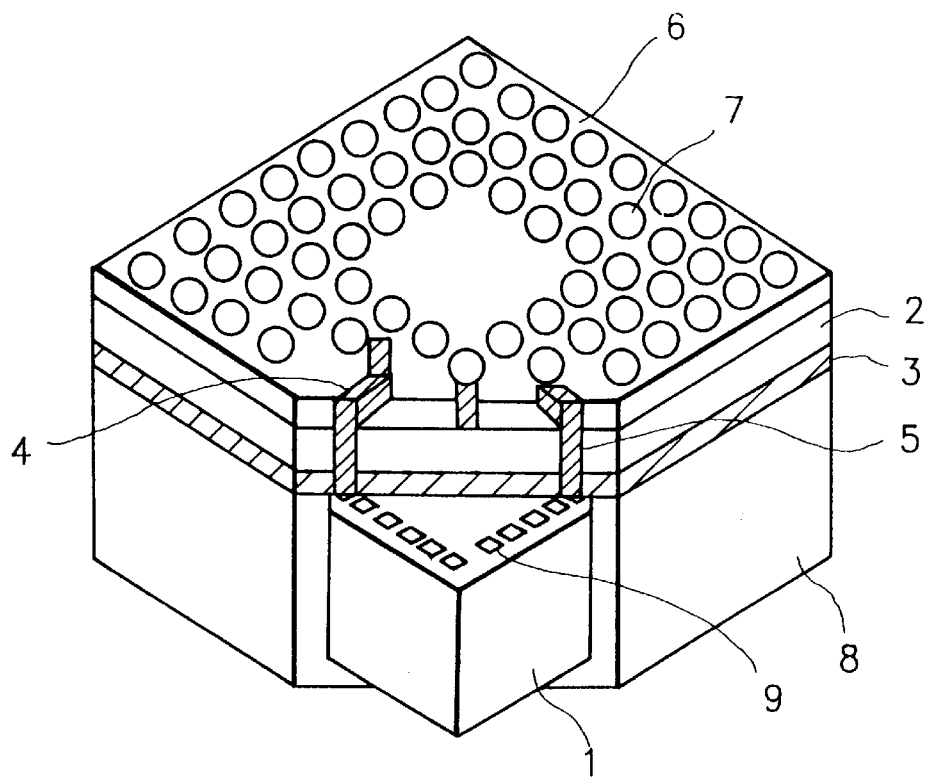
FIG. 1 is a partly sectional and broken perspective view showing a conventional CSP semiconductor device which is seen from the installation surface of the device.

Referring now to the drawings, a description will be given in detail of preferred embodiments in accordance with the present invention.

Figure 4:
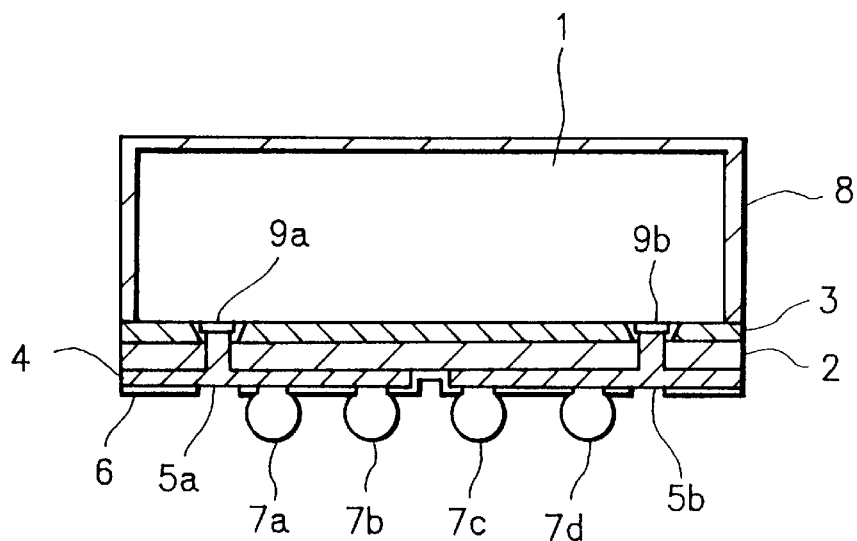
FIG. 4 is a vertical sectional view showing a semiconductor device according to an embodiment of the present invention.

FIG. 4 is a vertical sectional view showing a semiconductor device according to an embodiment of the present invention. In FIG. 4, the same reference characters as those of the conventional semiconductor device shown in FIG. 2 designate the same or corresponding parts to those of FIG. 2.

Figure 2:
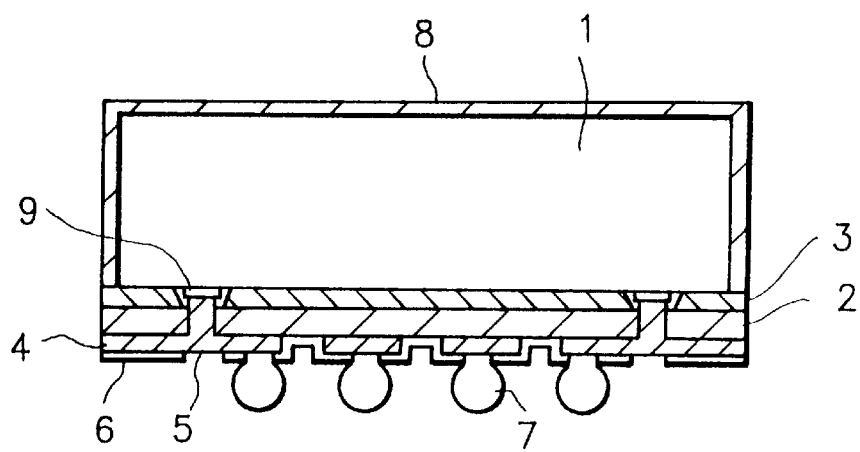
FIG. 2 is a vertical sectional view of the conventional semiconductor device of FIG. 1.
Figure 3:
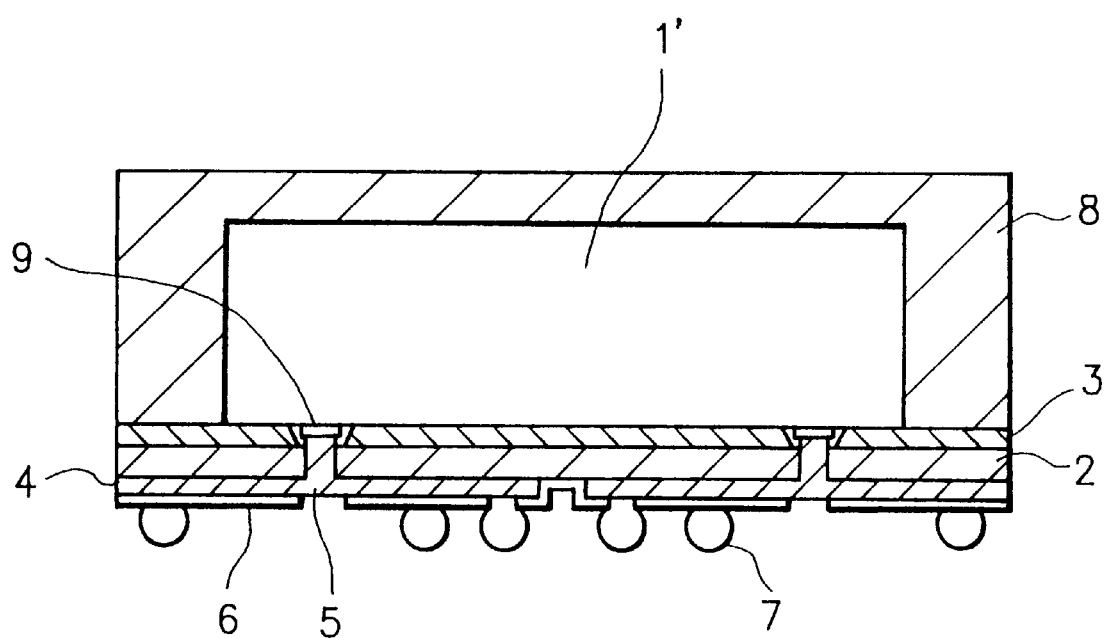
FIG. 3 is a vertical sectional view of the conventional semiconductor device of FIG. 1 in the case where the number of external connection terminals is larger.

The semiconductor device of FIG. 4 comprises a semiconductor chip 1 such as an LSI, a polyimide substrate 2, adhesive 3 for attaching the semiconductor chip 1 to the polyimide substrate 2, copper foils 4, a photoresist layer 6, solder bumps 7, and a sealing resin 8, similarly to the conventional semiconductor device of FIG. 2. The semiconductor chip 1 in this embodiment is mounted on the polyimide substrate 2 in similar way to the aforementioned flip chip installation technique.

Concretely, the semiconductor chip 1 is mounted on the polyimide intermediate substrate 2 by adhesive 3, with its circuit surface provided with connection terminals 9 facing the polyimide substrate 2. On the opposite surface of the polyimide substrate 2, the solder bumps 7a–7d composed of solder balls are formed on the copper foils 4, as external connection terminals. The copper foils 4 are coated with a photoresist layer 6 for preventing the solder bumps 7a–7d from spreading out during the installation process in which the semiconductor device is installed on a circuit board. Each copper foil 4 is formed on the polyimide substrate 2 to reach a point directly below a corresponding connection terminal 9a or 9b on the semiconductor chip 1, and one copper foil 4 and the corresponding connection terminal 9a or 9b are electrically connected by a copper through hole 5a or 5b, respectively. The connection is formed by means of gang bonding or single point bonding which is used in manufacturing TCP (Tape Carrier Package). The semiconductor chip 1 is covered by a sealing resin 8 to protect itself from outside effects.

Incidentally, the external connection terminals are not limited to the aforementioned solder ball type solder bumps 7, and of course, use of other types of solder bumps (projections), metal balls of other kinds of metals, metal bumps, metal land, etc. is also possible. As the metal balls, the metal bumps, and the metal lands, those which are coated with solder can also be used. When the semiconductor device is installed on a circuit board, connection between the semiconductor device and the circuit board is established via the external connection terminals (such as solder bumps 7). In cases where the external connection terminals are metal balls, metal bumps, or metal lands, with no solder, extra solder is used in the installation process. Additionally, the substrate in the semiconductor device, which is provided with through holes 5a, 5b, is not limited to the polyimide substrate 2, and use of a resin film other than polyimide, a printed circuit board, a ceramic (glass-epoxy etc.) circuit board, etc. is of course also possible.

As seen in FIG. 4, in the semiconductor device of this embodiment, two pieces of solder bumps 7a and 7b are connected to one connection terminal 9a via one copper through hole 5a, and two pieces of solder bumps 7c and 7d are connected to one connection terminal 9b via one copper through hole 5b, differently from the conventional semiconductor device of FIG. 2.

Figure 5:
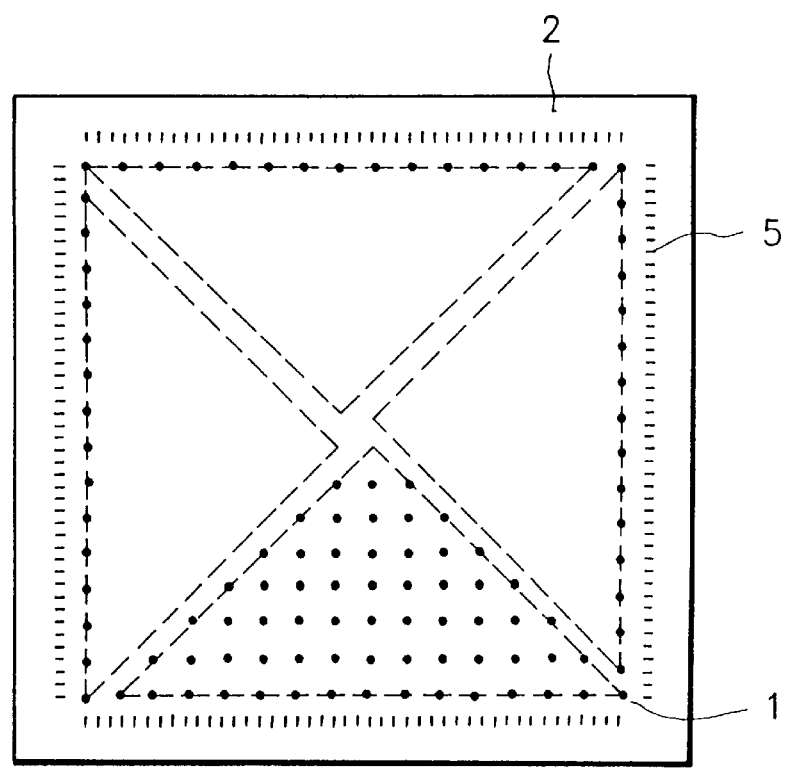
FIG. 5 is a bottom plan view of the semiconductor device of FIG. 4 seen from the installation surface of the device, in the case where the number of the external connection terminals is an even number.

FIG. 5 is a bottom plan view of the semiconductor device of FIG. 4 seen from the installation surface of the device, in the case where the number of the external connection terminals is an even number.

In FIG. 5, solder bumps 7 are shown only in the lower ¼ triangular area, and other equivalent (upper, right, left) areas with the same terminal layout are not shown for brevity.

As shown in FIG. 5, junctions between the connection terminals 9 of the semiconductor chip 1 and the copper through holes 5 are placed on the rim, and 256 (16×16) pieces of solder bumps 7 as external connection terminals are arranged inside the rim at intervals of 0.5 mm in a quadrangle grid pattern. Incidentally, the arrangement of the solder bumps 7 is not limited to the quadrangular grid pattern shown in FIG. 5, and other grid patterns such as a triangular grid pattern etc. are as well possible.

Figure 6:
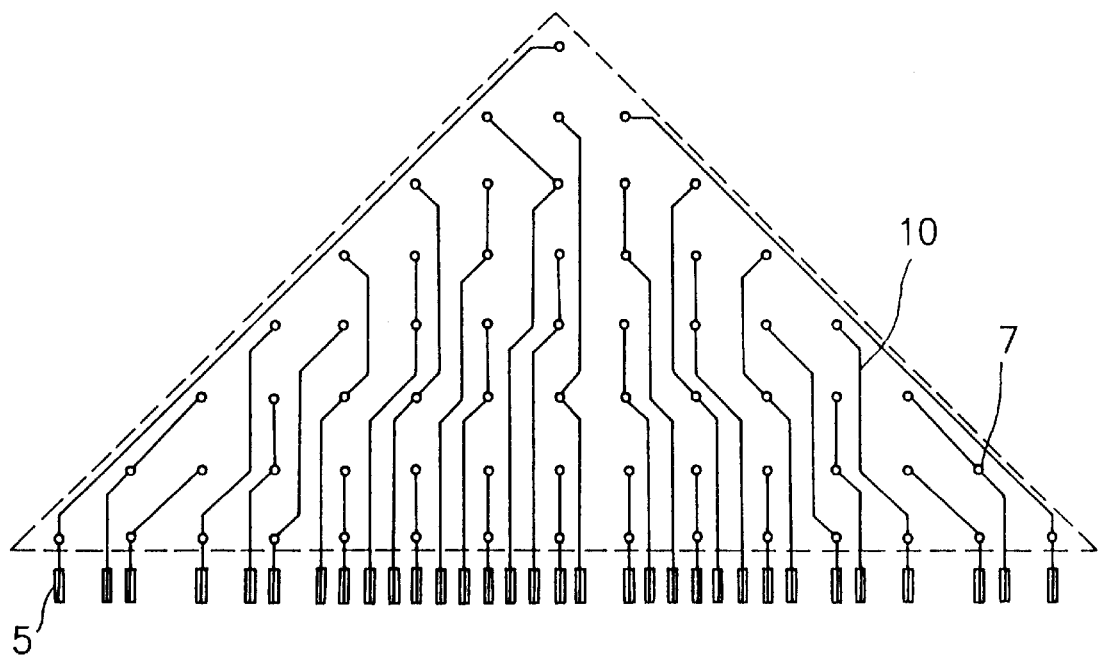
FIG. 6 is a schematic diagram showing an example of a circuit pattern on the installation surface of the semiconductor device of FIG. 5.

FIG. 6 is a schematic diagram showing an example of a circuit pattern 10 (copper foils 4) connecting the copper through holes 5 and the solder bumps 7. In FIG. 6, 64 pieces of solder bumps 7 and 32 pieces of copper through holes 5 are arranged so that each pair of solder bumps 7 will be connected to one corresponding copper through hole 5. Further, in a pair of solder bumps 7, one solder bump 7 is placed outside (near the rim) and the other is placed as inside as possible.

In the embodiment shown in FIG. 5 and FIG. 6, at least 7, 5 mm×7.5 mm of a layout space is necessary for the 256 pieces of solder bumps 7 when the pitch between the solder bumps 7 is 0.5 mm. Therefore, in order to arrange all the solder bumps 7 inside the rim, i.e. inside the copper through holes 5, the quadrangle formed by connection terminals 9 of the semiconductor chip 1 is needed to be larger than 8.5 mm×8.5 mm.

When the number of the solder bumps 7 is 256 and 100% of the connection terminals 9 of the semiconductor chip 1 are connected to corresponding two solder bumps 7 in a one-to-two correspondence, the number of the connection terminals 9 becomes 128. However, it is not necessary to apply the one-to-two correspondence to all the connection terminals 9 of the semiconductor chip 1. Generally, solder bumps 7 which are placed outside on the installation surface of the semiconductor device (i.e. near the edges of the polyimide substrate 2) tend to cause connection inferiority due to the thermal expansion of the polyimide substrate 2. Therefore, application of the one-to-two correspondence to part of the connection terminals 9 is practically enough, and the number of the connection terminals 9 can be increased to become larger than 128.

In the case where the pitch between pins is 124 μm, the largest possible number of the connection terminals 9 on the semiconductor chip 1 which are arranged in the quadrangle of 8.5 mm×8.5 mm can be as large as 272.

Figure 7:
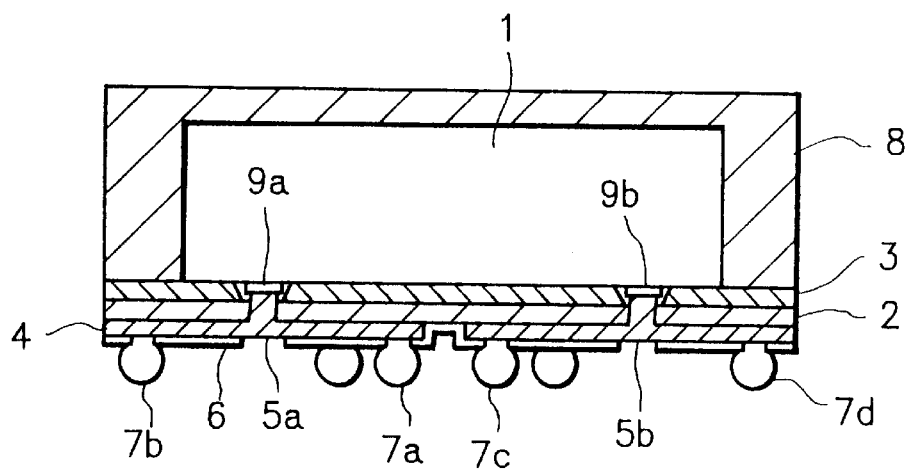
FIG. 7 is a vertical sectional view of the semiconductor device of FIG. 4 in the case where the number of external connection terminals is larger.

Therefore, in the embodiment of FIG. 5 and FIG. 6, there are 272 pins (connection terminals 9) on the semiconductor chip 1, and 128 pins out of the 272 pins are actually used. In order to use all the 272 pins and connect them with corresponding pairs of solder bumps 7 in the one-to-two correspondence, extra solder bumps 7b and 7d are needed to be placed in the area outside the connection terminals 9 of the semiconductor chip 1, as shown in FIG. 7.

Figure 8:
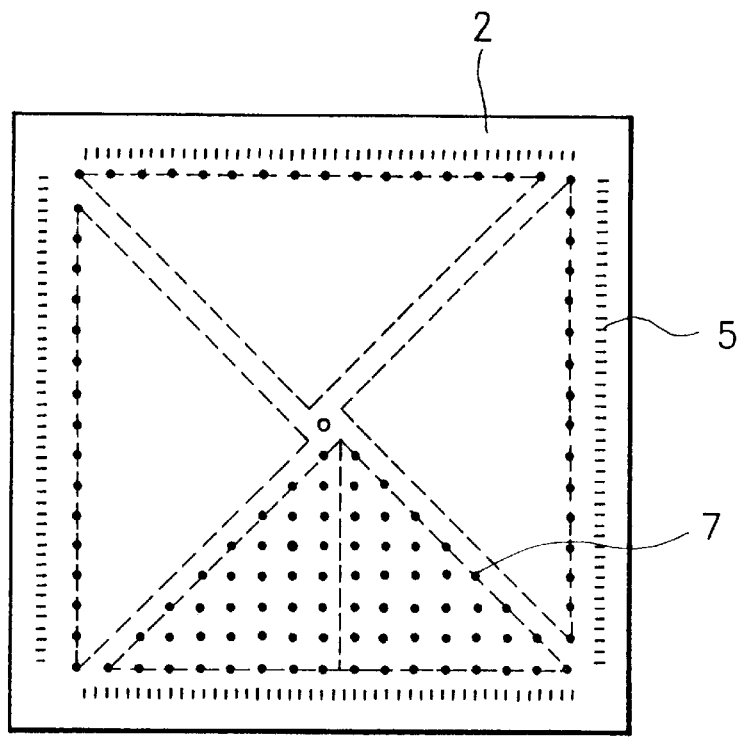
FIG. 8 is a bottom plan view of the semiconductor device of FIG. 4 seen from the installation surface of the device, in the case where the number of the external connection terminals is an odd number.

FIG. 8 is a bottom plan view of the semiconductor device of FIG. 4 seen from the installation surface of the device, in the case where the number of the external connection terminals is an odd number. In FIG. 8, solder bumps 7 are shown only in the lower ¼ triangular area, and other equivalent (upper, right, left) areas with the same terminal layout are not shown for brevity similarly to FIG. 5. The solder bumps 7 in the triangular area are arranged symmetric with respect to the broken line in FIG. 8.

As shown in FIG. 8, junctions between the connection terminals 9 of the semiconductor chip 1 and the copper through holes 5 are placed on the rim, and 289 (17×17) pieces of solder bumps 7 as external connection terminals are arranged inside the rim at intervals of 0.5 mm in a quadrangle grid pattern. However, the number of actually used solder bumps 7 is 288 since the center solder bump 7 is not used.

Figure 9:
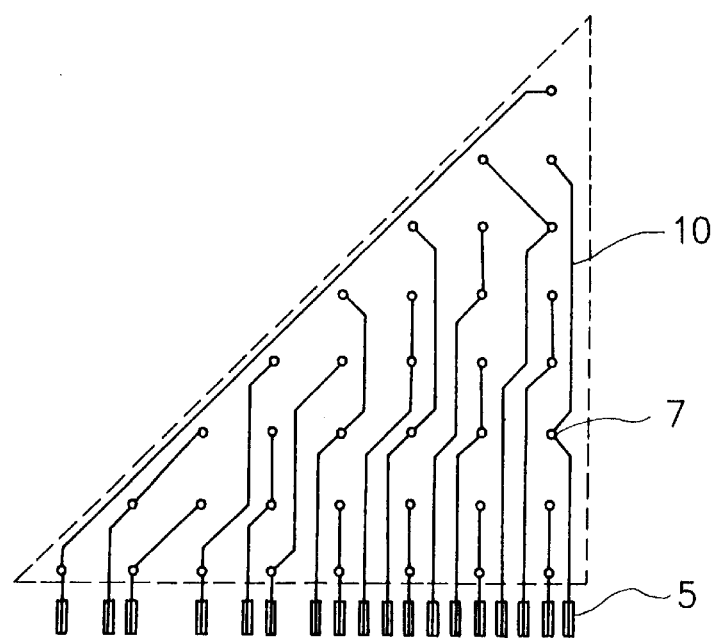
FIG. 9 is a schematic diagram showing an example of a circuit pattern on the installation surface of the semiconductor device of FIG. 8.

FIG. 9 is a schematic diagram showing an example of a circuit pattern 10 (copper foils 4) connecting the copper through holes 5 and the solder bumps 7, in which only the left side of the broken line is shown for brevity since layout of the solder bumps 7 in the right side is only a mirror image of the left side. In FIG. 9, 36 pieces of solder bumps 7 and 18 pieces of copper through holes 5 are arranged so that each pair of solder bumps 7 will be connected to one corresponding copper through hole 5. Further, in a pair of solder bumps 7, one solder bump 7 is placed outside and the other is placed as inside as possible.

In the embodiment shown in FIG. 8 and FIG. 9, at least layout space of a 8.0 mm×8.0 mm is necessary for the 288 pieces of solder bumps 7 when the pitch between the solder bumps 7 is 0.5 mm. Therefore, in order to arrange all the solder bumps 7 inside the copper through holes 5, the quadrangle formed by connection terminals 9 of the semiconductor chip 1 is needed to be larger than approximately 9.0 mm×9.0 mm.

When the number of the solder bumps 7 is 288 and 100% of the connection terminals 9 of the semiconductor chip 1 are connected to corresponding two solder bumps 7 in the one-to-two correspondence, the number of the connection terminals 9 becomes 144. However, it is not necessary to apply the one-to-two correspondence to all the connection terminals 9 of the semiconductor chip 1, and application of the one-to-two correspondence to part of the connection terminals 9 is practically enough and the number of the connection terminals 9 can be more than 144.

In the case where the pitch between pins is 124 μm, the largest possible number of the connection terminals 9 on the semiconductor chip 1 which can be arranged in the quadrangle of 9.0 mm×9.0 mm can be as large as 288.

Therefore, in the embodiment of FIG. 8 and FIG. 9, there are 288 pins on the semiconductor chip 1, and 144 pins out of the 288 pins are actually used. In order to use all the 288 pins and connect them with corresponding pairs of solder bumps 7 in the one-to-two correspondence, extra solder bumps are needed to be placed in the area outside the connection terminals 9 of the semiconductor chip 1, similarly to the case of FIG. 7.

In the installation process, the semiconductor device shown in FIG. 4 or FIG. 7 is mounted on a circuit board with its bump surface facing the circuit board, and electric connections between the semiconductor device and the circuit board are established by melted solder bumps 7.

As shown above, according to the first embodiment, one connection terminal 9 of the semiconductor chip 1 is designed to be connected to corresponding two external connection terminals (solder bumps 7). Therefore, even if connection inferiority occurred between one external connection terminal and the circuit board in the installation process, the probability of the case where connection inferiority occurs at both external connection terminals corresponding to the connection terminal 9 is low, thereby connection reliability between the semiconductor device and the circuit board can be remarkably improved.

Figure 10:
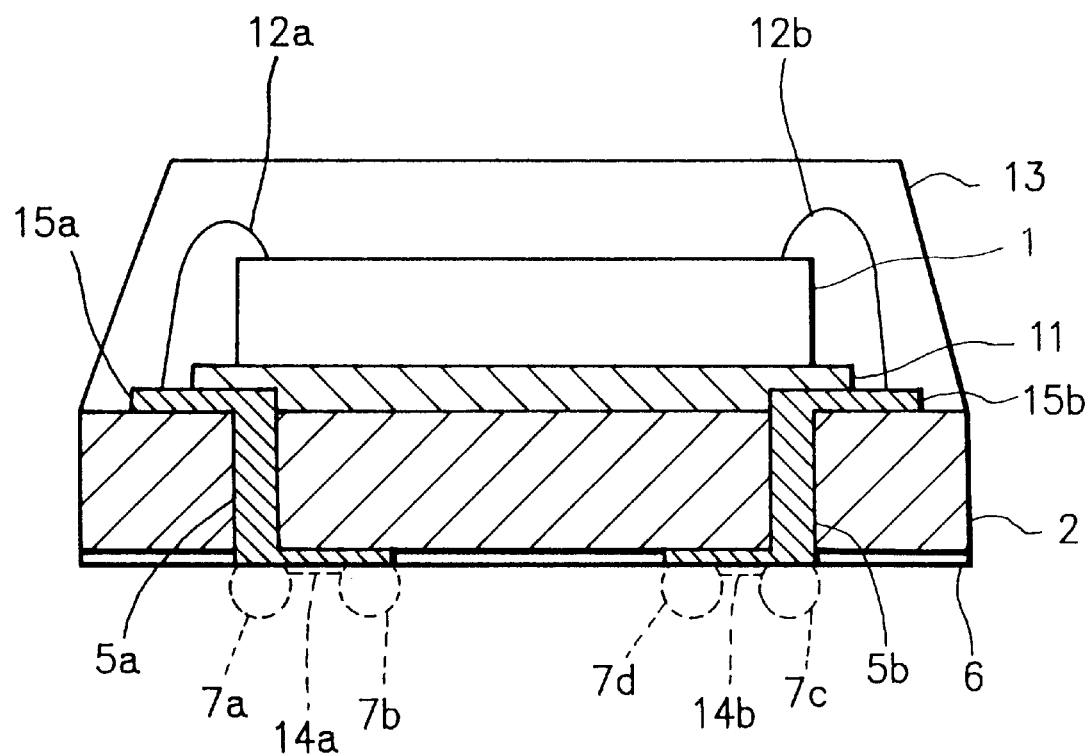
FIG. 10 is a vertical sectional view showing a semiconductor device according to the second embodiment of the present invention.

FIG. 10 is a vertical sectional view showing a semiconductor device according to the second embodiment of the present invention.

In the semiconductor device of FIG. 10, a semiconductor chip, provided with a plurality of connection terminals is mounted on an insulator 11 on a polyimide substrate 2. Incidentally, in the second embodiment, the connection terminals of the semiconductor chip 1 are provided on the upper surface of the semiconductor chip 1, and the semiconductor chip 1 is mounted on the polyimide substrate 2 in a similar way to the aforementioned chip on board installation technique.

On the opposite surface of the polyimide substrate 2 (i.e. the surface on which the semiconductor chip 1 is not mounted), a photoresist layer 6 and copper wiring patterns 14a and 14b are provided. Two solder bumps 7a and 7b are formed on the copper wiring pattern 14a as external connection terminals, and two solder bumps 7c and 7d are formed on the copper wiring pattern 14b as external connection terminals. The copper wiring patterns 14a and 14b pass through the polyimide substrate 2 via copper through holes 5a and 5b and reach the side on which the semiconductor chip 1 is mounted, and form copper terminals 15a and 15b, respectively. The whole body composed of polyimide substrate 2, the insulator 11, and the semiconductor chip 1 is coated with an epoxy resin 13.

Connection terminals of the semiconductor chip 1 are connected with corresponding copper terminals 15a and 15b by metal wires 12a and 12b, respectively. The copper terminals 15a and 15b are plated with Ni and Au. The copper terminals 15a and 15b are connected to the copper wiring patterns 14a and 14b on the opposite side via the copper through holes 5a and 5b respectively, and each of the copper wiring patterns 14a and 14b is provided with two pieces of solder bumps 7 as shown in FIG. 10.

As shown above, according to the second embodiment, the same effects as the first embodiment can be obtained and connection reliability between the semiconductor device and the circuit board can be remarkably improved, in the case where the semiconductor chip 1 is mounted on the polyimide substrate 2 in a similar way to the chip on board installation technique.

In the following, connection inferiority rate between one semiconductor chip 1 in the semiconductor device and the circuit board on which the semiconductor device is installed will be considered.

Figure 11:
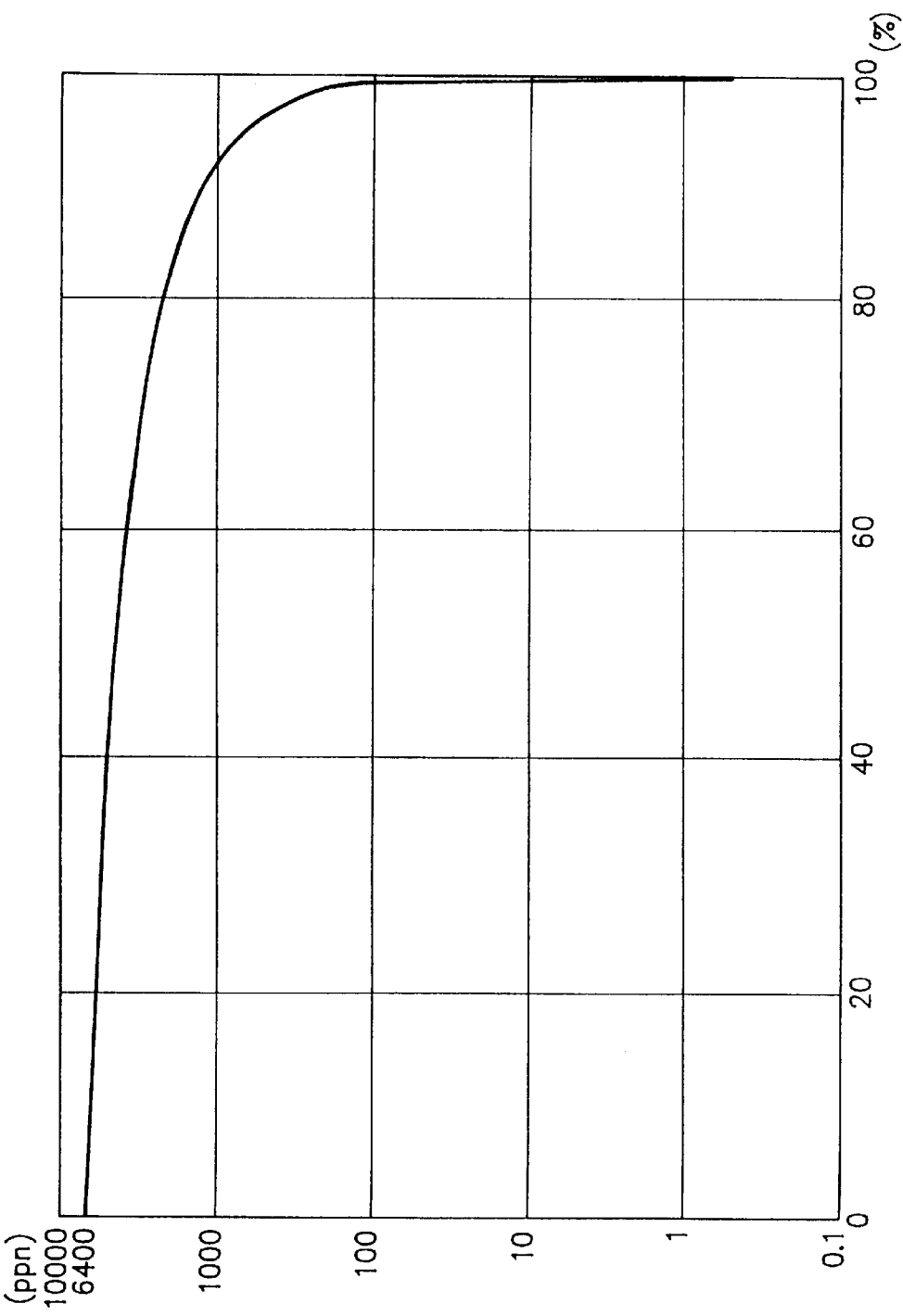
FIG. 11 is a graph showing the connection inferiority rate between one semiconductor chip in the semiconductor device and the circuit board.

FIG. 11 is a graph showing the connection inferiority rate between one semiconductor chip 1 and the circuit board, in the case of semiconductor device according to the present invention. In the semiconductor device for this consideration, the number of the connection terminals of the semiconductor chip 1 is 128, and N2 pieces of the connection terminals are designed to be connected to corresponding two external connection terminals (solder bumps 7) in the one-to-two correspondence, and N1 pieces of the connection terminals are designed to be connected to corresponding one external connection terminals in the one-to-one correspondence (N1+N2=128).

The horizontal axis of the graph of FIG. 11 represents the percentage of connection terminals which are designed to be connected to corresponding two external connection terminals, i.e. N2/(N1+N2)×100. The vertical axis of the graph represents the connection inferiority rate between one semiconductor chip 1 and the circuit board on which the semiconductor device is installed, in units of ppm (Part Per Million). Here, connection inferiority rate between one external connection terminal and the circuit board is a fixed value of 50 ppm (a track record or a performance figure).

In this model, the number of the connection terminals of the semiconductor chip 1 is 128, therefore, the number of the external connection terminals (solder bumps 7) which are intended to be connected with the connection terminals of the semiconductor chip 1 varies between 128 to 256 in the range between 0% and 100% of the horizontal axis.

The fixed connection inferiority rate of 50 ppm means 50 pieces of inferior connections among 1,000,000 pieces of connections between the external connection terminals and the circuit board, which is extremely low probability and connection reliability is high. And such connection inferiority rate can be attained and maintained by manufacturers with well controlled manufacturing process.

However, in the conventional case where the number of pins of the LSI (semiconductor chip 1) is 128 and one connection terminal is connected to only one external connection terminal, the connection inferiority rate per one LSI becomes 128×50 ppm=6400 ppm as shown in FIG. 11. And when one semiconductor chip is installed on one printed circuit board, 64 printed circuit boards our of 10,000 printed circuit boards (i.e. one printed circuit board out of 156 printed circuit boards) are necessitated to involve connection inferiority. That is not a negligible figure in quality control.

Meanwhile, in the case where one copper through hole 5 connected with one connection terminal of the semiconductor chip 1 is connected to two external connection terminals (solder bumps 7) as in the present invention, the probability of the case where both of two solder bumps 7 which are connected with one connection terminal simultaneously cause inferior connections with the circuit board is 50 ppm×50 ppm=0.0025 ppm, which is remarkably lower than the above one-to-one correspondence case. When all the connection terminals are planned to be connected to corresponding two solder bumps 7 (i.e. 100% in the horizontal axis), the connection inferiority rate per one LSI becomes 128×0.0025 ppm=0.32 ppm as shown in FIG. 11, which is 1/20.000 compared to the conventional one-two-one correspondence case.

The above calculation applies to 'open mode' connection inferiority only, in which the circuit board and the solder bump 7 are not successfully connected together, and the calculation does not apply to 'short mode' connection inferiority in which shorts occur between adjacent solder bumps 7 by solder bridges. However, in well controlled manufacturing process, the probability of the open mode connection inferiority is extremely higher than that of the short mode connection inferiority, since the short mode connection inferiority is caused by adhesion of electrically conducting dust, inadequate management of the amount of solder (in the case of solder connection), etc. Therefore, consideration of the open mode connection inferiority is practically enough for a test calculation of the connection inferiority rate.

In the following, an appropriate rate (N2/(N1+N2)×100) of connection terminals of a semiconductor chip 1 which should be connected to corresponding two external connection terminals (solder bumps 7) will be discussed.

The rate (i.e. N2/(N1+N2)×100, hereafter referred to as 'rate A') and the connection inferiority rate per one LSI (semiconductor chip 1) vary keeping the relation shown in FIG. 11. As shown in FIG. 11, connection reliability remains low when the rate A is small, and rapidly increases as the rate A approaches 100%, and thus it is clear that the rate A=100% (i.e. the case where all the connection terminals are planned to be connected to corresponding two external connection terminals) is ideal. However, even if the rate A is not set at 100%, the rate A larger than 90% can remarkably improve the connection reliability by more than one order of magnitude. Therefore the rate A of 90% or more is preferable with regard to production cost, production efficiency, etc.

Incidentally, although each connection terminal of the semiconductor chip 1 was planned to be connected to corresponding two external connection terminals (solder bumps 7) in the one-to-two correspondence in the above embodiments, of course it is as well possible to connect one connection terminal to corresponding three external connection terminals in a one-to-three correspondence. The one-to-three correspondence is also effective for decreasing the connection inferiority rate between the semiconductor chip 1 and the circuit board, but has less practical advantage than the aforementioned one-to-two correspondence.

For example, connection inferiority rate per one connection terminal of the semiconductor chip 1 in the case where one connection terminal, is connected to corresponding three external connection terminals is calculated as 50 ppm×50 ppm×50 ppm=0.000000125 ppm, which is an extremely satisfactory figure. However, the one-to-three correspondence needs a larger number of external connection terminals and larger layout space for the external connection terminals, and may cause other type of inferiority or errors. Therefore, the one-to-three correspondence is not advantageous in point of cost/performance in consideration of deterioration of packaging efficiency. However, application of the one-to-three correspondence to part of the connection terminals is of course possible, and it is also possible, for example, to apply the one-to-one correspondence to N1 pieces of connection terminals, the one-to-two correspondence to N2 pieces of connection terminals, the one-to-three correspondence to N3 pieces of connection terminals, etc.

As set forth hereinabove, in the semiconductor device according to the present invention, one connection terminal of a semiconductor chip is designed to be connected to two or more corresponding external connection terminals, thereby connection reliability between the semiconductor device and the circuit board can be remarkably improved. Especially, installation process of semiconductor devices of BGA (Ball Grid Array) type, TBGA (Tape Ball Grid Array) type, CSP type, etc. onto the circuit board can be executed with a higher success rate and a remarkably higher degree of efficiency.

Further, according to the present invention, larger number of external connection terminals are bonded to the circuit board, therefore bonding strength between the circuit board and the semiconductor device is highly increased, thereby the connection reliability between the semiconductor device and the circuit board is improved with a synergistic effect.

Furthermore, stress which is applied to an external connection terminal due to difference of the thermal expansion between the semiconductor device and the circuit board becomes larger as the position of the external connection terminal on the substrate becomes outside. Therefore, by placing one external connection terminal (solder bump 7) outside on the substrate 2 and placing the other external connection terminal as inside as possible as shown in FIG. 6 and FIG. 9, the success rate or the yield in the installation process and the connection reliability for the long term can be improved.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device comprising:
   a substrate on which a plurality of external connection terminals are formed; and
   a semiconductor chip provided with a plurality of connection terminals, the connection terminals being connected to corresponding external connection terminals by electrical wiring;
   wherein each of at least 90% of the connection terminals of the semiconductor chip are connected to two or more corresponding external connection terminals on the substrate.

2. A semiconductor device as claimed in claim 1, wherein the connection terminals of the semiconductor chip are connected to two corresponding external connection terminals in a one-to-two correspondence.

3. A semiconductor device as claimed in claim 1, wherein the external connection terminals are arranged on the installation surface of the semiconductor device in a grid pattern.

4. A semiconductor device as claimed in claim 3, wherein the external connection terminals are arranged in a quadrangular grid pattern.

5. A Semiconductor device as claimed in claim 1, wherein the external connection terminal is composed of a solder ball.

6. A semiconductor device as claimed in claim 1, wherein the external connection terminal is composed of a solder bump.

7. A semiconductor device as claimed in claim 1, wherein the external connection terminal is composed of a metal ball.

8. A semiconductor device as claimed in claim 1, wherein the external connection terminal is composed of a metal bump.

9. A semiconductor device as claimed in claim 1, wherein the external connection terminal is composed of a metal land.

10. A semiconductor device as claimed in claim 1, wherein the external connection terminals are arranged so that one of the two or more external connection terminals corresponding to the connection terminal is placed outside on the substrate and another one of the two or more external connection terminals is placed inside on the substrate.

11. A semiconductor device as claimed in claim 1, wherein all the external connection terminals are arranged inside a quadrangle which is formed by the connection terminals of the semiconductor chip.

12. A semiconductor device as claimed in claim 1, wherein the substrate is composed of a ceramic circuit board.

13. A semiconductor device as claimed in claim 1, wherein the substrate is composed of a printed circuit board.

14. A semiconductor device as claimed in claim 1, wherein the substrate is composed of a resin film.

* * * * *

UNITED STATES PATENT AND TRADEMARK OFFICE
CERTIFICATE OF CORRECTION

PATENT NO. : 6,013,953
DATED : January 11, 2000
INVENTOR(S) : Toshiyuki Nishihara, et al.

Page 1 of 1

It is certified that error appears in the above-identified patent and that said Letters Patent is hereby corrected as shown below:

<u>Title page,</u>
Item [56], References Cited, FOREIGN PATENT DOCUMENTS " WO97/01866" should read -- WO 97/01866 A1 01/16/97 PCT --

<u>Column 3,</u>
Line 56, "one-to one" should read -- one-to-two --

<u>Column 5,</u>
Line 40, "land" should read -- lands --

Signed and Sealed this

Twenty-ninth Day of January, 2002

*Attest:*

*Attesting Officer*

JAMES E. ROGAN
*Director of the United States Patent and Trademark Office*